(12) United States Patent
Chung et al.

(10) Patent No.: US 11,036,118 B2
(45) Date of Patent: *Jun. 15, 2021

(54) HEAT DISSIPATION MODULE AND PROJECTION APPARATUS

(71) Applicant: Coretronic Corporation, Hsin-Chu (TW)

(72) Inventors: Wen-Yen Chung, Hsin-Chu (TW); Yi-Han Lai, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 60 days.

This patent is subject to a terminal disclaimer.

(21) Appl. No.: 16/561,044

(22) Filed: Sep. 5, 2019

(65) Prior Publication Data

US 2020/0081331 A1 Mar. 12, 2020

(30) Foreign Application Priority Data

Sep. 7, 2018 (CN) .......................... 201821460990.7

(51) Int. Cl.
*G03B 21/16* (2006.01)
*G03B 21/14* (2006.01)
(Continued)

(52) U.S. Cl.
CPC ............. *G03B 21/16* (2013.01); *F28D 1/024* (2013.01); *F28D 15/02* (2013.01); *G03B 21/145* (2013.01);
(Continued)

(58) Field of Classification Search
CPC .. G03B 21/16; G03B 21/145; G03B 21/2033; F28D 1/024; F28D 15/02;
(Continued)

(56) References Cited

U.S. PATENT DOCUMENTS 5,842,514 A * 12/1998 Zapach ................. H01L 23/427
165/104.33
7,174,951 B1 * 2/2007 Lin ......................... F28D 15/02
165/104.21

(Continued)

FOREIGN PATENT DOCUMENTS

CN 103324013 9/2013

*Primary Examiner* — Michelle M Iacoletti
*Assistant Examiner* — Magda Cruz
(74) *Attorney, Agent, or Firm* — JCIPRNET

(57) ABSTRACT

A heat dissipation module and a projection apparatus are provided. The heat dissipation module dissipates the heat generated by a plurality of heating elements, includes a heat pipe, a heat dissipation plate, a first and a second heat dissipation fins. The heat pipe includes a first portion of the heat pipe passes through the first heat dissipation fin and a second portion of the heat pipe passes through the second heat dissipation fin and a third portion connected with the first and the second portions. The third portion of the heat pipe and the heating elements are connected to the heat dissipation plate. The heat generated by the heating elements is dissipated by the heat dissipation plate, the first and the second heat dissipation fins through thermal conduction method and thermal convection method. The invention saves accommodating space in the projection apparatus and has an efficient heat dissipation effect.

18 Claims, 2 Drawing Sheets

(51) Int. Cl.
*G03B 21/20* (2006.01)
*H04N 9/31* (2006.01)
*F28D 1/02* (2006.01)
*F28D 15/02* (2006.01)
*H05K 7/20* (2006.01)
*H01B 7/42* (2006.01)
*F28D 21/00* (2006.01)

(52) U.S. Cl.
CPC ......... *G03B 21/2033* (2013.01); *H01B 7/426* (2013.01); *H05K 7/20136* (2013.01); *H05K 7/20336* (2013.01); *F28D 2021/0029* (2013.01); *H04N 9/3114* (2013.01)

(58) Field of Classification Search
CPC ........ F28D 2021/0029; H05K 7/20136; H05K 7/20336; H04N 9/3114; H01B 7/426
See application file for complete search history.

(56) References Cited

U.S. PATENT DOCUMENTS

| | | | | |
|---|---|---|---|---|
| 7,613,001 B1* | 11/2009 | Liu | ..................... | H05K 7/20336 165/104.33 |
| 10,824,061 B2* | 11/2020 | Chung | ................ | F28D 15/0233 |
| 2007/0029072 A1* | 2/2007 | Lee | ........................ | H01L 23/467 165/104.33 |
| 2008/0218980 A1* | 9/2008 | Tracewell | ........... | H05K 7/20672 361/713 |
| 2009/0195756 A1* | 8/2009 | Li | .......................... | G03B 21/20 353/54 |
| 2010/0265468 A1* | 10/2010 | Lin | ..................... | F28D 15/0266 353/58 |
| 2011/0019161 A1* | 1/2011 | Chen | ..................... | H04N 9/3164 353/61 |
| 2011/0024088 A1* | 2/2011 | Lin | ........................ | F28D 15/02 165/104.26 |
| 2011/0157560 A1* | 6/2011 | Hsiao | ..................... | G03B 21/16 353/58 |
| 2011/0181842 A1* | 7/2011 | Kanno | .................. | G03B 21/16 353/52 |
| 2013/0170133 A1* | 7/2013 | Fu | .............................. | G06F 1/20 361/679.47 |
| 2014/0293541 A1* | 10/2014 | Opila | ........................ | F28F 1/32 361/697 |
| 2017/0112018 A1* | 4/2017 | Krivonak | ........... | H05K 7/20263 |
| 2017/0277027 A1* | 9/2017 | Fukuda | ............... | F28D 15/0266 |
| 2019/0239391 A1* | 8/2019 | Hsiao | ................. | H05K 7/20336 |
| 2020/0068745 A1* | 2/2020 | Lin | ..................... | H05K 7/20172 |

* cited by examiner

HEAT DISSIPATION MODULE AND PROJECTION APPARATUS

CROSS-REFERENCE TO RELATED APPLICATION

This application claims the priority benefit of China application serial no. 201821460990.7, filed on Sep. 7, 2018. The entirety of the above-mentioned patent application is hereby incorporated by reference herein and made a part of this specification.

BACKGROUND

Field of the Invention

The invention relates a heat dissipation module and a projection apparatus and more particularly, to a heat dissipation module with an efficient heat dissipation effect and a projection apparatus using the heat dissipation module.

Description of Related Art

In general, the primary heat sources are a light source and a light valve in a projection apparatus. In a conventional projection apparatus, a heat transfer system of a heat dissipation device, the heat sources are connected to heat sinks respectively for heat dissipation. However, in this method the entire system layout of the projection apparatus may be dispersed, in such a way that more air guiding structures would be required for solving an airflow issue. Moreover, an airflow volume of the entire system of the projection apparatus is also reduced, thereby reducing the heat dissipation capability of the projection apparatus.

The "Description of Related Art" section is only intended for enhancing understanding of the invention and therefore the content disclosed in the "Description of Related Art" section may contain information that does not form the related art already known to people skilled in the art. The disclosure in the "Description of Related Art" section does not mean that the content or the issues addressed by one or more embodiments of the invention are already previously known or recognized by people skilled in the art.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY OF THE INVENTION

The invention provides a heat dissipation module with an efficient heat dissipation effect.

The invention further provides a projection apparatus including the aforementioned heat dissipation module, to reduce the space consumption in the projection apparatus and have an efficient heat dissipation effect.

Other features and advantages of the invention can be further understood by the technical features disclosed in the invention.

To achieve one, part, or all of the objectives aforementioned or other objectives, a heat dissipation module of an embodiment of the invention for dissipating heat from a plurality of heating elements, and includes a heat pipe, a dissipation plate, a first heat dissipation fin and a second heat dissipation fin. The heat pipe includes a first portion, a second portion and a third portion connected with the first and the second portions. The first portion and the second portion are disposed in parallel to each other. The third portion of the heat pipe and the heating elements are connected to the heat dissipation plate. The first portion of the heat pipe passes through the first heat dissipation fin. The second portion of the heat pipe passes through the second heat dissipation fin. The heat generated by the heating elements is dissipated by the heat dissipation plate, the first heat dissipation fin and the second heat dissipation fin through a thermal conduction method and a thermal convection method.

A projection apparatus provided by another embodiment of the invention includes a chassis, an optical engine, a projection lens and a heat dissipation module. The chassis has an air inlet and an air outlet. The optical engine is disposed inside the chassis and includes a plurality of heating elements. The projection lens is disposed inside the chassis and connected with the optical engine. The heat dissipation module is disposed inside the chassis, and includes a heat pipe, a dissipation plate, a first heat dissipation fin and a second heat dissipation fin. The heat pipe includes a first portion, a second portion and a third portion connected with the first and the second portions. The first portion and the second portion are disposed in parallel to each other. The third portion of the heat pipe and the heating elements are connected to the heat dissipation plate. The first portion of the heat pipe passes through the first heat dissipation fin. The second portion of the heat pipe passes through the second heat dissipation fin. The heat generated by the heating elements is dissipated by the heat dissipation plate, the first heat dissipation fin and the second heat dissipation fin through a thermal conduction method and a thermal convection method.

Based on the above, the embodiments of the invention achieve at least one of the following advantages or effects. In this design of the heat dissipation module of the invention, the heat generated by the heating elements which are disposed on the heat dissipation plate is dissipated by a thermal conduction method and a thermal convection method and the heating elements relatively adjacent to the first portion of the heat pipe can also directly dissipated in a thermal convection method. In other words, the design of the heat dissipation module of the invention provides one more heat dissipation method of thermal convection, so as to achieve an efficient heat dissipation effect. Moreover, the projection apparatus using the heat dissipation module of the invention, can achieve an efficient dissipation effect, in addition it can effectively reduce the space consumption in the projection apparatus and reduce volume and noise of the projection apparatus because all the heating elements are disposed on the heat dissipation plate, which are integrated as one heat source.

Other objectives, features and advantages of the invention will be further understood from the further technological features disclosed by the embodiments of the invention where there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. The terms used herein such as "above," "below," "front," "back," "left," and "right" are for the purpose of describing directions in the figures only. Accordingly, the drawings and descriptions will be regarded as illustrative in nature and not as restrictive.

Figure 1:
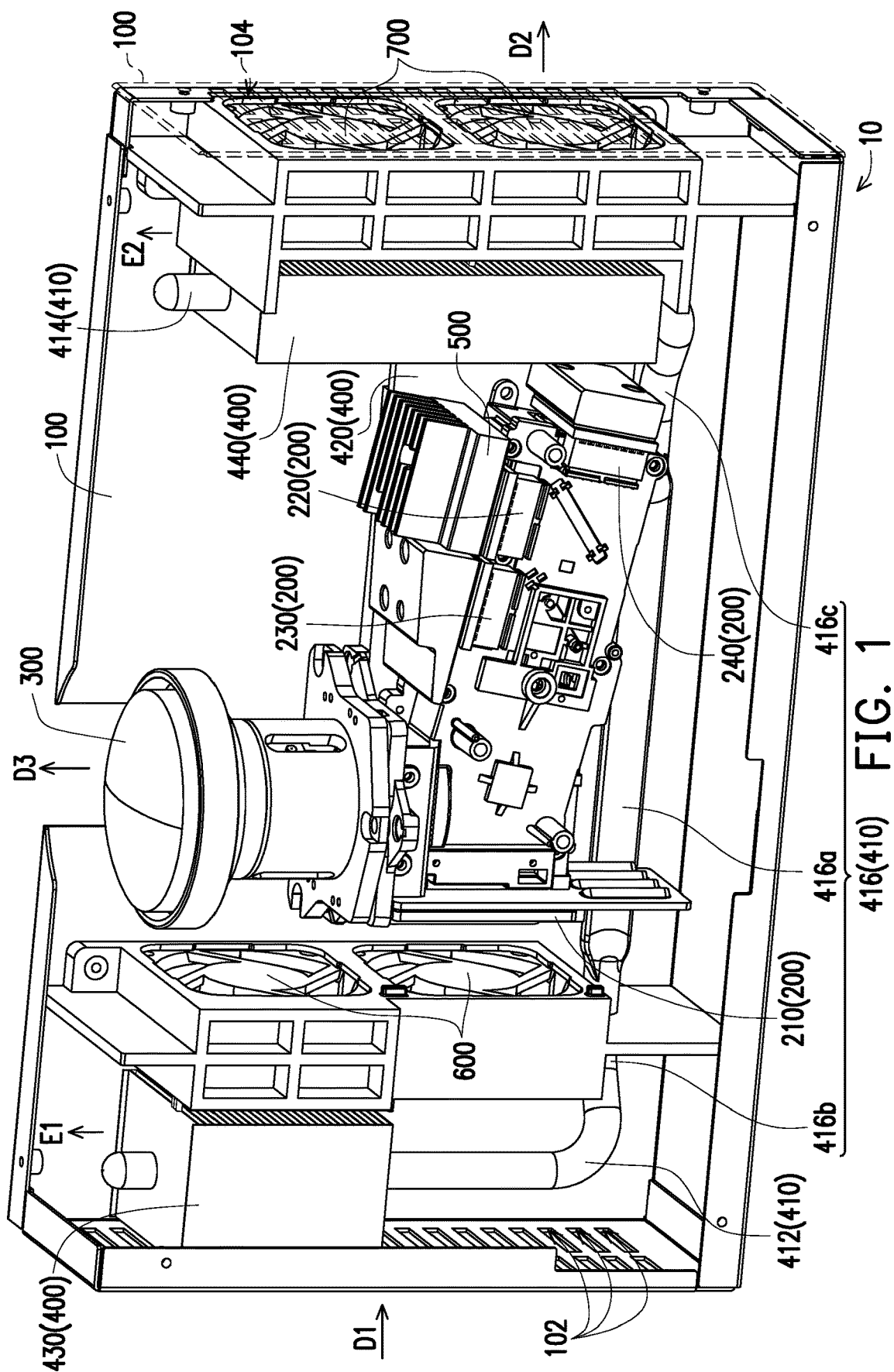
FIG. 1 is a schematic diagram of a projection apparatus according to an embodiment of the invention.
Figure 2:
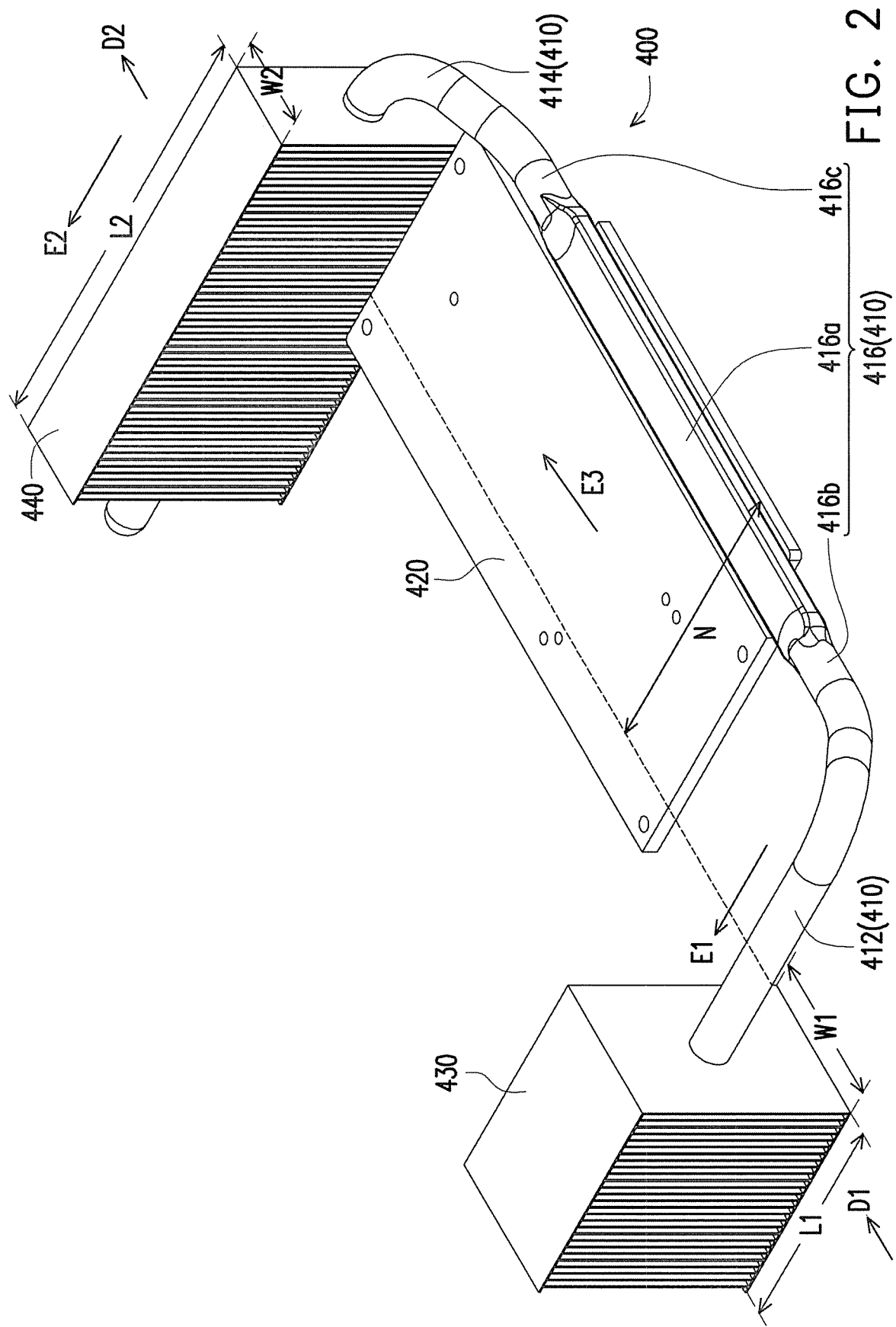
FIG. 2 is a schematic diagram of a heat dissipation module of the projection apparatus depicted in FIG. 1.

FIG. 1 is a schematic diagram of a projection apparatus according to an embodiment of the invention. FIG. 2 is a schematic diagram of a heat dissipation module of the projection apparatus depicted in FIG. 1. It should be mentioned that for clarity and descriptive convenience, a part of the elements (e.g., a part of a chassis is omitted, and a part of the chassis is represented by dashed lines. Referring to FIG. 1 and FIG. 2, in the embodiment, a projection apparatus includes a chassis 100, an optical engine 200, a projection lens 300 and a heat dissipation module 400. An air inlet 102 is provided at a side of the chassis 100, and an air outlet 104 is provided at the other side of the chassis 100, wherein the air inlet 102 and the air outlet 104 are respectively located at two opposite sides of the chassis 100. The optical engine 200 is disposed inside the chassis 100 and includes a plurality of heating elements 210, 220, 230 and 240, wherein the heating elements 220, 230 and 240 include, for example, a plurality of light sources employed to emit an illumination beam, and the heating element 210 which is located on a transmission path of the illuminating beam and capable of converting the illuminating beam to an image beam is, for example, a light valve. In this case, the light valve 210 is a light modulation device, for example, a digital micromirror device (DMD), the invention is not limited thereto. In other embodiments, the light modulation device may also be a reflective liquid crystal on silicon (LCOS) or a transparent liquid crystal panel. The light sources are, for example, solid-state illumination sources, such as light emitting diodes (LED) or laser diodes. In this case, the light sources which include a red LED 220, a green LED 230 and a blue LED 240 are taken as an example for description. The projection lens 300 is disposed inside the chassis 100, connected with the optical engine 200 and employed to project the image beam out of the chassis 100. As illustrated in FIG. 1, an air entering direction D1 of the air inlet 102 and an air exiting direction D2 of the air outlet 104 of the chassis 100 are not in parallel to a projection direction D3 of the projection lens 300. For example, the air entering direction D1 of the air inlet 102 and the air exiting direction D2 of the air outlet 104 of the chassis 100 are in perpendicular to the projection direction D3 of the projection lens 300, the invention is not limited thereto. The air entering direction D1 and the air exiting direction D2 are defined as flowing directions of a cold airflow.

Referring again to FIG. 1 and FIG. 2, the heat dissipation module 400 of the embodiment is disposed inside the chassis 100 and includes a heat pipe 410, a dissipation plate 420, a first heat dissipation fin 430 and a second heat dissipation fin 440. The heat pipe 410 includes a first portion 412, a second portion 414 and a third portion 416 connected with the first portion 412 and the second portion 414, wherein the first portion 412 and the second portion 414 are disposed in parallel to each other. In this case, the heat pipe 410 is embodied in a U-shape, and the first portion 412 and the second portion 414 are disposed symmetrically to each other. Additionally, a length of the second portion 414 is equal to a length of the first portion 412, but the invention is not limited thereto. In other embodiments, the length of the second portion 414 may be greater than the length of the first portion 412, so as to meet a size of the second heat dissipation fin 440. The third portion 416 of the heat pipe 410 is connected with the heat dissipation plate 420. The third portion 416 of the heat pipe 410 and the heating elements 210, 220, 230 and 240 are located on the heat dissipation plate 420. The heating elements 210, 220, 230 and 240 are connected with the heat dissipation plate 420. The third portion 416 of the heat pipe 410 includes a contact portion 416a, a first connection portion 416b and a second connection portion 416c. The contact portion 416a contacts the heat dissipation plate 420 and is connected with the first connection portion 416b and the second connection portion 416c, wherein a diameter of the contact portion 416a is greater than a diameter of the first connection portion 416b and greater than a pipe diameter of the second connection portion 416c, thereby increasing a heat dissipation area to improve a heat dissipation efficiency. The first connection portion 416b is connected with the first portion 412 and the contact portion 416a of the heat pipe 410, and the second connection portion 416c is connected with the second portion 414 and the contact portion 416a of the heat pipe 410. The first portion 412 of the heat pipe 410 passes through the first heat dissipation fin 430, and the second portion 414 of the heat pipe 410 passes through the second heat dissipation fin 440. The heating elements 220, 230 and 240 are disposed at a side of the heat dissipation plate 420 and adjacent to the second portion 414 of the heat pipe 410, the heating element 210 is disposed at the other side of the heat dissipation plate 420 and adjacent to the first portion 412 of the heat pipe 410.

It is to be mentioned that the heat pipe 410 is a hollow pipe and made of metal, for example, copper. The heat pipe 410 is internally filled with a cooling liquid, for example, water, and the pipe wall has a capillary structure or added with a porous material for returning the cooling liquid back to a heating end through an action of capillary force. The heat pipe 410 is adapted to transfer the heat from the heat dissipation plate 420. The U-shaped heat pipe 410 features in the first portion of the heat pipe 410 passing through the first heat dissipation fin 430 and the second portion 414 of the heat pipe 410 passing through the second heat dissipation fin 440. Specifically, a length L2 of the second heat dissipation fin 440 along an extension direction E2 of the second portion 414 is greater than a length L1 of the first heat dissipation fin 430 along an extension direction E1 of the first portion 412. Namely, the length L2 of the second heat dissipation fin 440 is greater than the length L1 of the first heat dissipation fin 430. Orthogonal projections of the heat dissipation plate 420 and the first heat dissipation fin 430 in an extension direction E3 of the heat dissipation plate 420 has a non-overlapping portion N. Because the length of the second portion 414 of the heat pipe 410 is equal to or slightly greater than the length of the first portion 412, this means that a part of the first portion 412 of the heat pipe 410 is not blocked by the first heat dissipation fin 430. In this case, the extension direction E1 of the first portion 412 and the extension direction E2 of the second portion 414 are both perpendicular to the air entering direction D1 of the air inlet 102 and the air existing direction of the air outlet 104. As illustrated in FIG. 1, the first heat dissipation fin 430 does not block the heat dissipation plate 420 in the air entering direction D1, and thus, when the cold airflow flowing through the air inlet 102 enters the chassis 100, the heat generated by the heating element 210 among the heating elements 210, 220, 230 and 240 may be dissipated to the outside in a direct thermal convection method as well as a thermal conduction and a thermal convection method. In other words, besides the heat generated by the heating elements 210, 220, 230 and 240 may be dissipated through thermal conduction provided by the heat dissipation plate 420 plus thermal convection provided by the first heat dissipation fin 430 and the second heat dissipation fin 440, the heating element 210 which is relatively adjacent to the first portion 412 of the heat pipe 410 may also be cooled directly through thermal convection provided by a part of the cold airflow which enters through the air inlet 102 without flowing through the first heat dissipation fin 430. Moreover, the design of the heat dissipation module 400 of the embodiment provides one more heat dissipation path of thermal convection to achieve an efficient heat dissipation effect. In addition, as the heating element 210 (i.e., the light valve) is not heat-resistant, the heating element 210 is cooled directly by the cold airflow, thereby effectively increasing the lifespan and reliability.

Furthermore, the heat dissipation plate 420 of the heat dissipation module 400 is located between the projection lens 300 and the third portion 416 of the heat pipe 410 and on the bottom of the optical engine 200. Namely, the heat pipe 410 is far away from the projection lens 300 to prevent the influence on the optical performance due to projection lens 300 being heated by the hot air surrounding the heat pipe 410. The heat dissipation plate 420 is connected with the bottom of the optical engine 200. Based on a demand of high luminance, the green LED 230 is placed upstream of air flow direction in favor of heat dissipation, and the blue LED 240 which is relatively insensitive to the temperature is placed downstream of air flow direction, thereby preventing other heat sources or optical elements from being influenced, wherein the upstream and the downstream of the air flow direction refer to a sequence of the cold airflow flowing through a plurality of light sources of the heating elements. Therefore, as illustrated in FIG. 1, the red LED 220 and the blue LED 240 are located at two sides of adjacent corner of the heat dissipation plate 420, and the red LED 220 and the blue LED 240 are disposed relatively perpendicular to each other. The green LED 230 and the red LED 220 are disposed adjacent to each other, and the green LED 230 is more adjacent to the light valve 210 than the other LEDs. In addition, the performance of the red LED 220 can be reduced due to high temperature, and thus, in order to improve a heat dissipation efficiency of the red LED 220, the projection apparatus 10 may further include a heat sink 500. The heat sink 500 is connected with the red LED 220 to increase a heat dissipation through thermal conduction method.

Additionally, in order to increase an intensity of the cold airflow throughout the projection apparatus 10, the projection apparatus 10 may further include a plurality of first fans 300 (which are schematically illustrated as two in FIG. 1) and a plurality of second fans (which are schematically illustrated as two in FIG. 1). The first fans 600 are disposed inside the chassis 100 and located between the first portion 412 of the heat pipe 410 and the heat dissipation plate 420. The second fans 700 are disposed inside the chassis 100 and located between the second portion 414 of the heat pipe 410 and the air outlet 104. In addition, the second fans 700 disposed between the second portion 414 of the heat pipe 410 and the air outlet 104, and disposed away from the heat sources (the heating elements), such that a space is provided for the airflow (the hot air) to gather and then be exhausted out of the projection apparatus 10 by the second fans 700. When a part of the cold airflow enters the chassis 100 from the air inlet 102, it sequentially flows through the first heat dissipation fin 430/the first portion 412 of the heat pipe 410, the first fans 600, the light valve 210/the projection lens 300, the green LED 230/the red LED 220/the blue LED 240, the second heat dissipation fin 440, the second fans 700 and the air outlet 104, thereby dissipating the heat generated by the heating elements 210, 220, 230 and 240 from the chassis 100.

In the embodiment, as described above the length L2 of the second heat dissipation fin 440 being greater than the length L1 of the first heat dissipation fin 430, the cold airflow entering through the air inlet 102 of the chassis and the first fans 300 adjacent to the light valve 210 directly aims the cold airflow toward the light valve 210, without flowing through the first heat dissipation fin 430, such that more cold airflow may directly transmitted to the light valve 210 to reduce the temperature of the light valve 210. In other words, the first heat dissipation fin 430 is not disposed between the air inlet 102 and the first fans 600 which are adjacent to the light valve 210. In addition, a normal line of an active surface (a surface with a micro-lens) of the light valve 210 is perpendicular to the projection direction D3 of the projection lens.

As illustrated in FIG. 2, a width W1 of the first heat dissipation fin 430 is greater than a width W2 of the second heat dissipation fin 440. In addition, a volume of the second heat dissipation fin 440 is greater than a volume of the first heat dissipation fin 430, and thus, the second heat dissipation fin 440 is capable of dissipating more heat from the chassis 100 than the first heat dissipation fin 430. Therefore, the cold airflow flowing through the first heat dissipation fin 430, reduces the heat from the projection lens 300 located in downstream of the airflow, and do not affect the optical performance of the projection lens 300.

Based on the above, the embodiments of the invention can achieve at least one of the following advantages or effects. In this design of the heat dissipation module of the invention, the length of the second heat dissipation fin along the extension direction of the second portion of the heat pipe is greater than the length of the first heat dissipation fin along the extension direction of the first portion of the heat pipe, and the first heat dissipation fin does not block the air entering direction towards the heat dissipation plate. Therefore, the heat generated by the heating elements which is disposed on the heat dissipation plate is dissipated by a thermal conduction and a thermal convection method and the heating elements relatively adjacent to the first portion of the heat pipe can also directly dissipated in a thermal convection method. In other words, the design of the heat dissipation module of the invention provides one more heat dissipation method of thermal convection to achieve an efficient heat dissipation effect. Moreover, the projection apparatus using the heat dissipation module of the invention, can achieve an efficient dissipation effect, in addition it may effectively reduce the space consumption in the projection apparatus, reduce volume and noise of the projection apparatus because all the heating elements are disposed on the heat dissipation plate, which are integrated as one heat source.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. A heat dissipation module for dissipating heat from a plurality of heating elements, comprising;
    a heat pipe;
    a heat dissipation plate;
    a first heat dissipation fin; and
    a second heat dissipation fin;
    wherein the heat pipe comprises a first portion, a second portion and a third portion connected with the first and the second portions, wherein the first portion and the second portion are disposed in parallel to each other;
    the third portion of the heat pipe and the heating elements are connected to the heat dissipation plate;
    the first portion of the heat pipe passes through the first heat dissipation fin;
    the second portion of the heat pipe passes through the second heat dissipation fin, wherein the heat generated by the heating elements is dissipated by the heat dissipation plate, the first heat dissipation fin and the second heat dissipation fin in a thermal conduction method and a thermal convection method;
    a length of the second heat dissipation fin along an extension direction of the second portion is greater than a length of the first heat dissipation fin along an extension direction of the first portion, orthogonal projections of the heat dissipation plate and the first heat dissipation fin in an extension direction of the heat dissipation plate has a non-overlapping portion.

2. The heat dissipation module according to claim 1, wherein the third portion of the heat pipe further comprises;
    a contact portion;
    a first connection portion; and
    a second connection portion;
    wherein the contact portion contacts the heat dissipation plate and is connected with the first connection portion and the second connection portion, the first connection portion is connected with the first portion and the contact portion of the heat pipe, and the second connection portion is connected with the second portion and the contact portion of the heat pipe.

3. The heat dissipation module according to claim 1, wherein a width of the first heat dissipation fin is greater than a width of the second heat dissipation fin.

4. The heat dissipation module according to claim 1, wherein a volume of the second heat dissipation fin is greater than a volume of the first heat dissipation fin.

5. The heat dissipation module according to claim 1, wherein the heat dissipation plate is relatively adjacent to the second portion of the heat pipe.

6. The heat dissipation module according to claim 1, wherein an air entering direction of a cold airflow is not in parallel to the extension direction of the first portion, and the first heat dissipation fin does not block the heat dissipation plate in the air entering direction.

7. A projection apparatus, comprising:
    a chassis, having an air inlet and an air outlet;
    an optical engine, disposed inside the chassis and comprises a plurality of heating elements;
    a projection lens, disposed inside the chassis and connected with the optical engine;

a heat dissipation module, disposed inside the chassis and comprises:
a heat pipe;
a heat dissipation plate;
a first heat dissipation fin; and
a second heat dissipation fin;
wherein the heat pipe comprises a first portion, a second portion and a third portion connected with the first and the second portions, wherein the first portion and the second portion are disposed in parallel to each other;
the third portion of the heat pipe and the heating elements are connected to the heat dissipation plate;
the first portion of the heat pipe passes through the first heat dissipation fin;
the second portion of the heat pipe passes through the second heat dissipation fin, wherein the heat generated by the heating elements is dissipated by the heat dissipation plate, the first heat dissipation fin and the second heat dissipation fin in a thermal conduction method and a thermal convection method;
a plurality of first fans, disposed inside the chassis and located between the first portion of the heat pipe and the heat dissipation plate; and
a plurality of second fans, disposed inside the chassis and located between the second portion of the heat pipe and the air outlet.

8. The projection apparatus according to claim 7, wherein the heating elements comprise:
a plurality of light sources, disposed at one side of the heat dissipation plate and adjacent to the second portion of the heat pipe and employed to emit an illumination beam; and
a light valve, disposed at the other side of the heat dissipation plate and adjacent to the first portion of the heat pipe, wherein the light valve is located on a transmission path of the illumination beam, and employed to convert the illumination beam into an image beam.

9. The projection apparatus according to claim 8, wherein a normal line of an active surface of the light valve is perpendicular to a projection direction of the projection lens.

10. The projection apparatus according to claim 8, wherein the light sources comprise a red light-emitting diodes (LED), a green LED and a blue LED, the red LED and the blue LED are located at two sides of a corner of the heat dissipation plate, the green LED and the red LED are disposed adjacent to each other, and the green LED is relatively adjacent to the light valve.

11. The projection apparatus according to claim 10, further comprising:
a heat sink, connected with the red LED.

12. The projection apparatus according to claim 7, wherein the third portion of the heat pipe comprises a contact portion, a first connection portion and a second connection portion, the contact portion contacts the heat dissipation plate and is connected with the first connection portion and the second connection portion, the first connection portion is connected with the first portion and the contact portion of the heat pipe, and the second connection portion is connected with the second portion and the contact portion of the heat pipe.

13. The projection apparatus according to claim 7, wherein a width of the first heat dissipation fin is greater than a width of the second heat dissipation fin.

14. The projection apparatus according to claim 7, wherein a volume of the second heat dissipation fin is greater than a volume of the first heat dissipation fin.

15. The projection apparatus according to claim 7, wherein the heat dissipation plate is relatively adjacent to the second portion of the heat pipe.

16. The projection apparatus according to claim 7, wherein the heat dissipation plate is located between the projection lens and the third portion of the heat pipe.

17. The projection apparatus according to claim 7, wherein an air entering direction of the air inlet and an air exiting direction of the air outlet are not in parallel to a projection direction of the projection lens.

18. The projection apparatus according to claim 7, wherein the first heat dissipation fin is not between the air inlet and the first fans adjacent to the light valve.

* * * * *